United States Patent [19]
Lee et al.

[11] Patent Number: 6,096,655
[45] Date of Patent: Aug. 1, 2000

[54] METHOD FOR FORMING VIAS AND TRENCHES IN AN INSULATION LAYER FOR A DUAL-DAMASCENE MULTILEVEL INTERCONNECTION STRUCTURE

[75] Inventors: Young Hoon Lee, Somers; Ying Zhang, Yorktown Heights, both of N.Y.

[73] Assignee: International Business Machines, Corporation, Armonk, N.Y.

[21] Appl. No.: 09/146,228

[22] Filed: Sep. 2, 1998

[51] Int. Cl.[7] .................................................. H01L 21/302
[52] U.S. Cl. ........................... 438/700; 438/702; 438/753
[58] Field of Search .................................... 438/700, 702, 438/704, 753

[56] References Cited

U.S. PATENT DOCUMENTS

| | | | |
|---|---|---|---|
| 5,652,182 | 7/1997 | Cleeves | 438/631 |
| 5,723,381 | 3/1998 | Grewal et al. | 438/633 |
| 6,033,977 | 3/1998 | Gutsche et al. | 438/618 |

Primary Examiner—Benjamin L. Utech
Assistant Examiner—Donald L. Champagne
Attorney, Agent, or Firm—Whitham, Curtis & Whitham; Manny W. Schecter, Esq.

[57] ABSTRACT

In a dual-damascene processes for multi level interconnection a method for forming trenches and vias in the inter-insulation is accomplished without etching out the inter-insulation layer. A thick sacrificial layer is first deposited and reversed etched to form sacrificial pillars 64 forming the vias and sacrificial bridges 72 forming the trenches. The sacrificial layer can be any material (insulator, semiconductor, or metal), provided it can be easily patterned and selectively removed later over the inter insulator layer. Thereafter a low-k inter-insulation layer is deposited around the sacrificial pillars and bridges. It is these sacrificial pillars and bridges that are etched away leaving behind vias and trenches in the inter-insulation layer. An advantage of the invention is that it replaces a difficult RIE process of vias and trenches with a much easier RIE of sacrificial pillars and bridges. In the preferred embodiment, a silicon film, either amorphous or polycrystalline, is used as the sacrificial layer.

6 Claims, 7 Drawing Sheets

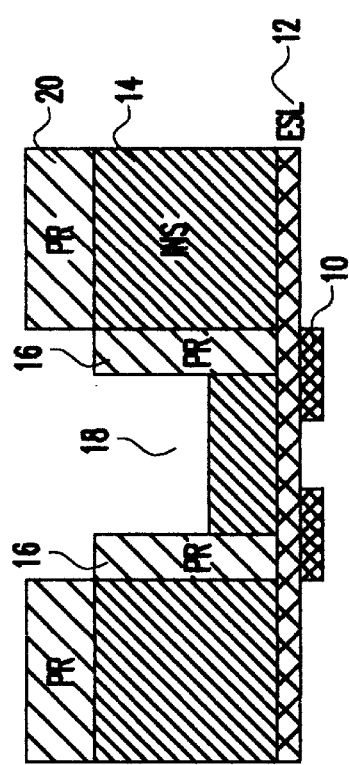
FIG.2D PRIOR ART
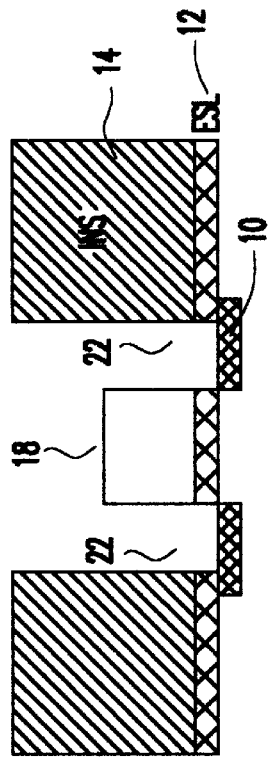
FIG.2E PRIOR ART
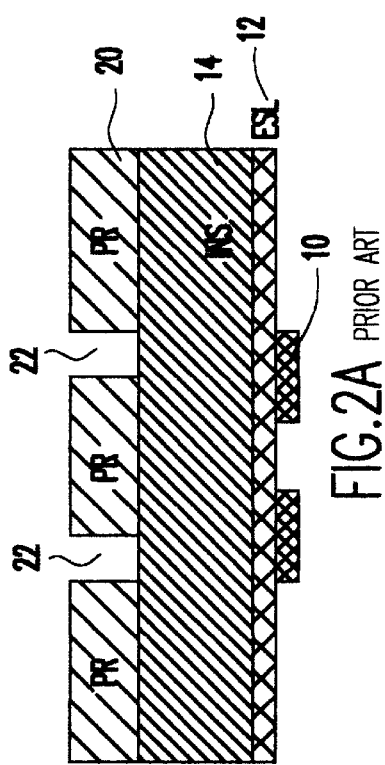
FIG.2A PRIOR ART
FIG.2B PRIOR ART
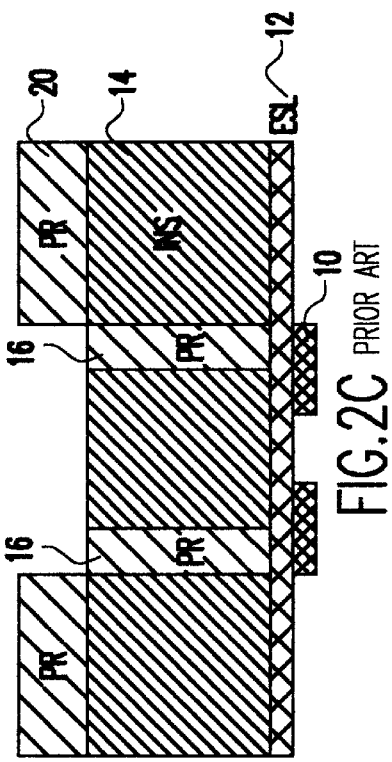
FIG.2C PRIOR ART

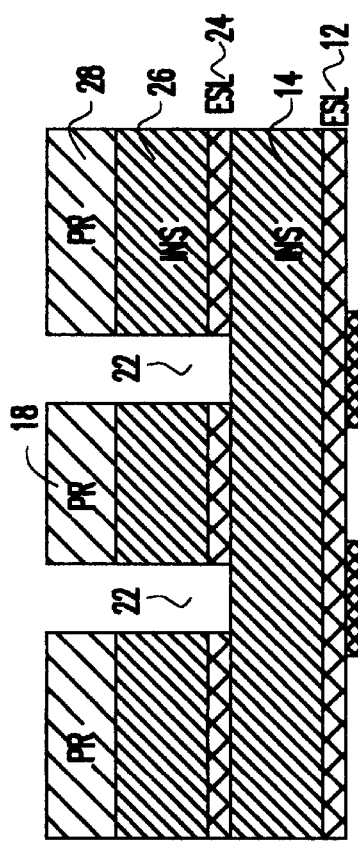
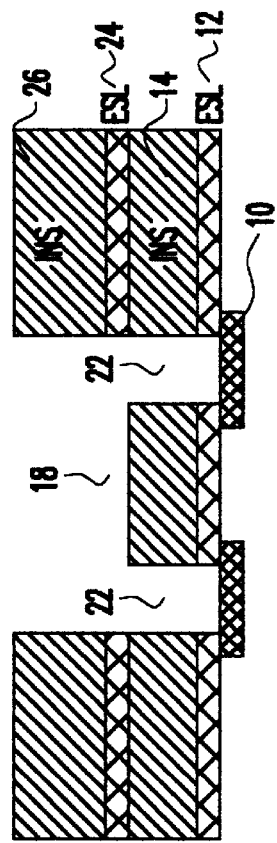
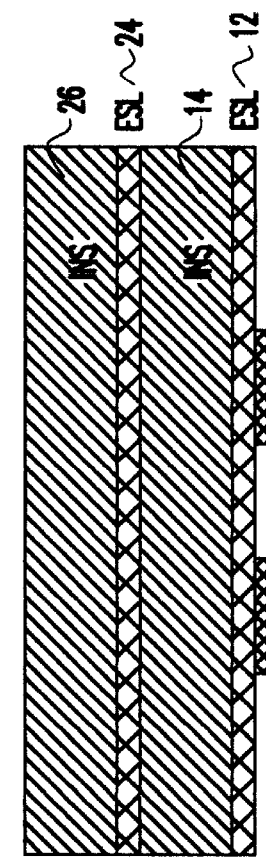
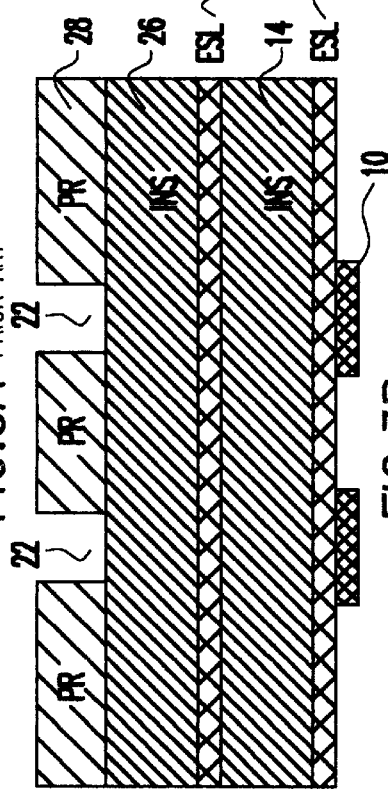
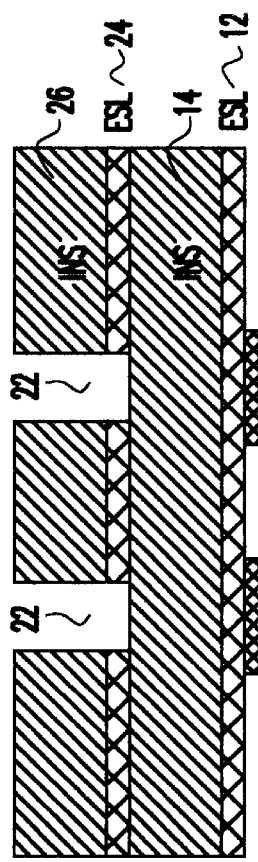
FIG. 3A PRIOR ART
FIG. 3B PRIOR ART
FIG. 3C PRIOR ART
FIG. 3D PRIOR ART
FIG. 3E PRIOR ART

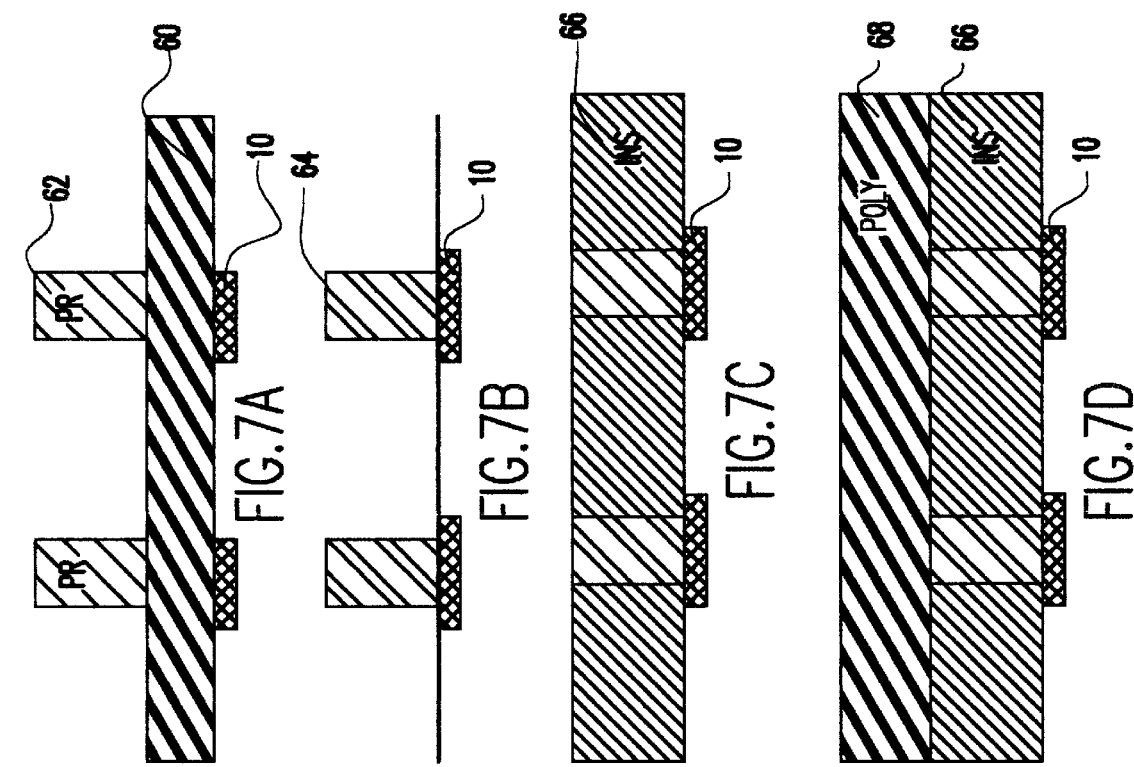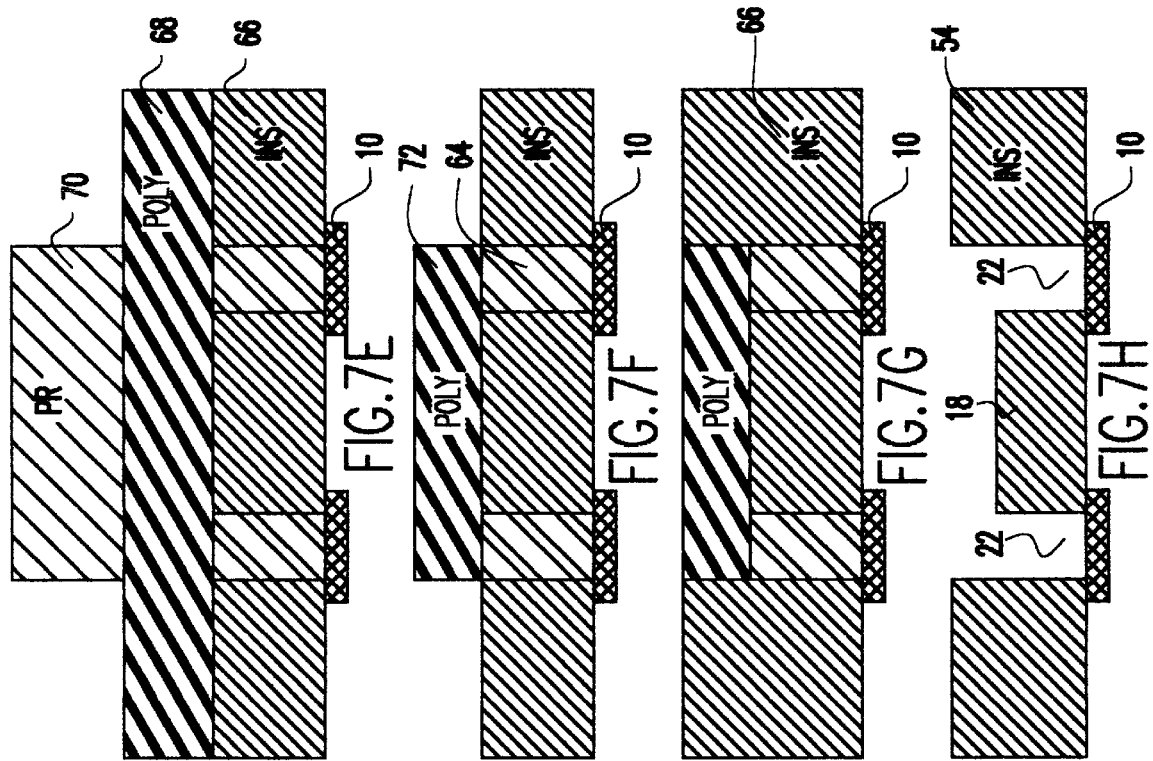

METHOD FOR FORMING VIAS AND TRENCHES IN AN INSULATION LAYER FOR A DUAL-DAMASCENE MULTILEVEL INTERCONNECTION STRUCTURE

BACKGROUND OF THE INVENTION

1. Field of the Invention

The present invention generally relates to inter-layer insulating materials for multilevel metal interconnection in microelectronics and, more particularly, to a dual-damascene process for patterning vias and trenches within an insulating layer for electrically isolating metal wires on microelectronic chips without etching out the insulating layer.

2. Description of the Related Art

The present invention is directed to a fabrication process for producing via holes and wiring trenches in the inter-layer insulating materials for multilevel metal interconnection microelectronics. For the sake of manufacturing simplicity, it is advantageous to form both the vias and trenches by a single process step. This single process step is ref erred to a "dual-damascene" process. The inter-layer insulator may be silicon dioxide as is currently being used in copper interconnection technology, or a low-k (k=dielectric constant) insulating material as is currently being pursued for the next generation of copper interconnection technology. The present invention is particularly well suited for future interconnection technologies which will demand a minimum feature size much smaller than the present (i.e., feature sizes of below 250 nm).

Current copper-based interconnection technology is based on the dual-damascene process, in which (i) the shape of contact holes and wiring trenches is first formed in an insulating film by reactive ion etching (RIE), (ii) a copper film is next deposited on the insulator, and then (iii) unwanted portion of the copper film is removed by a chemical-mechanical polishing, leaving Cu inside vias and trenches. This invention is primarily directed to the first step of patterning vias and trenches within an insulating layer which electrically isolates between metal wires on microelectronics chips.

There are a number of different fabrication schemes to realize a dual-damascene structure in silicon dioxide film, but each of the prior art methods create major technological difficulties which hampers practical manufacturing applications, particularly when utilizing a low-k insulating material of a poor etch resistance over a photo-resist mask. Prior art dual-damascene processes are discussed below with reference to FIGS. 1 to 5. For simplicity, like structures are given the same reference numerals.

Referring to FIGS. 1a–1d, there is shown a "trench first" dual-damascene process where a long trench pattern is etched first and then via patterns are etched at the bottom of a trench. Specifically, FIG. 1a shows an etch stop layer (ESL) 12 covering Cu wires 10. An insulation layer 14 is deposited over the etch stop layer 12 and a trench pattern 18 is defined in the insulation layer 14 by a photo-resist mask (PR) 16. In FIG. 1b the trench is etched and in FIG. 1c a photo resist mask 20 is deposited in the trench to define the via pattern. Finally, in FIG. 1d, the vias 22 and the etch stop layer 12 are etched with a reactive ion etch (RIE) exposing the wires 10 and the photo-resist masks 16 and 20 are stripped.

The major difficulty of this process sequence is the accuracy of the lithography overlay between the trench pattern and the via hole pattern inside a trench structure. A small misalignment could cause a large decrease in the Cu wire contact area 10, critical for the electrical performance. A pattern definition inside a narrow trench of below sub-250 nm will not be trivial in the future. Other practical issues may arise from the RIE process in terms of an effective etch stop at the bottom of a trench and via hole.

FIGS. 2a–2e shows a schematic of another process sequence called "via-first", where the via holes 22 are etched first and then the trench 18 is etched afterward. Note that the resultant structure shown in FIG. 2e is the same as in the "trench first" process shown in FIG. 1d. In the "via first" case, a resist residue 16 may be left inside via holes 22 during the step of a trench pattern definition and must be cleaned prior to a copper deposition. Unfortunately, just as in the "trench first" case of FIG. 1, the "via first" case of FIG. 2 has the same photo-resist mask overlay alignment problem.

FIGS. 3a–3e describe another dual-damascene process that introduces an additional etch stop layer 24 to overcome the difficulty of stopping at the bottom of vias and trenches. As shown in FIG. 3a, the additional inter-etch stop layer (ESL) 24 is placed on top of the insulation layer 14. Thereafter, a second insulation layer 26 is placed atop of the inter-ESL 24. As shown in FIG. 3b, a photo-resist (PR) mask 28 defines the via pattern 22 over the second insulation layer 26. In FIG. 3c the vias 22 are etched and the inter-ESL 24 is opened with a RIE. In FIG. 3d the trench 18 is patterned and in FIG. 3e the trench 18 and the remainder of the vias 22 are etched with a RIE exposing the wires 10.

A choice of the etch stop layer material, 12 and 24, is limited to a few insulating films compatible to $SiO_2$ or a low-k insulator 1<k<4. The most popular etch stopper is $Si_3N_4$ film. A significant drawback of the nitride film is its high k-value near k=7, in comparison to k=4 for $SiO_2$ and k=1–3 for a variety of low-k materials. Therefore, the etch stop layer must be very thin to maintain the overall "effective" dielectric constant very low. A higher k-value means a larger RC time constant. The etch stop layer material should have a high etch selectivity over the inter layer insulator for a given RIE process. The actual process flow described in FIG. 3 is similar to the "trench-first" process described in FIG. 1, except for an additional layer of the inter-ESL 24 to ensure the integrity of a physical dimension of vias, 22, and trenches 18.

FIG. 4 shows a similar process sequence as the "via first" process shown in FIG. 2, but with an inter etch stop layer 24 to provide more accurate control of the trench depth 18. After etching vias and stopping at the inter etch stopper 24 (FIGS. 4a–4c), an extra etch step is used to open via mask on the inter etch stop layer 24 as shown in FIG. 4d. Trenches were then patterned with resist masks 26. The trenches 18 and second half of vias 22 are etched at the same time. The trench thicknesses are predetermined by the inter etch stop layer as shown in FIG. 4d.

FIGS. 5a–5d describes yet another dual-damascene process, where two etch steps for vias and trenches are reduced to one etch step. As shown in FIGS. 5a–5b, after the first insulator layer 14 is deposited or spun on the first ESL 12 and the inter etch stop layer 24 is formed, via holes 22 are patterned using a photo-resist mask 16 and opened on the inter-ESL 24. In FIG. 5c, the second insulating layer 26 with a thickness of trench depth 18 is then formed on top of the inter etch stop layer 24. If a trench resist mask 28 is patterned with accurate alignment with the via openings 22 on the inter etch stop layer 24, the trench 18 and vias 22 will be etched in one step. The trenches 18 stop at the inter etch stop layer 24 and vias 22 stop at the second etch stop layer.

The dual-damascene processes described in FIGS. 3, 4, and 5 can only provide a way to accurately control the trench thickness and stopping vias by introducing etch stop layers at the expense of increasing "effective" dielectric constant k value. All other process and integration issues, such as etching via through a deep resist mask, contact area to underlying metal layer, mask alignment accuracy, etc. still remain to be solved. An additional layer of the etch stopper further complicates the dual-damascene process, and an increase in the "effective" k-value significantly limits these process schemes to be viable for future copper interconnection technologies with a low-k insulating material.

SUMMARY OF THE INVENTION

It is therefore an object of the present invention to provide a dual-damascene process for forming vias and trenches in the inter-layer insulator for multilevel metal interconnection microelectronics which eliminates the use of an etch stopper of a high-k material (such as silicon nitride film).

It is yet a further object of the present invention to trade the conventional reactive ion etching (RIE) of trenches and vias for an easier RIE of "pillars" and "bridges".

According to the invention, to overcome the technical problems associated with the current practice of etching the vias and trenches patterns in the inter-insulation layer for a dual-damascene processes, a thick sacrificial layer is first deposited and reversed etched to form sacrificial pillars forming the vias and sacrificial bridges forming the trenches. Unlike the prior art etch stop layer, the thick sacrificial layer is not limited to an insulator of a low k value, but can be any material (insulator, semiconductor, or metal), provided it can be easily patterned and selectively removed later over the inter insulator layer. Thereafter the low-k inter-insulation layer is deposited around the sacrificial pillars and bridges. It is these sacrificial pillars and bridges that are etched away leaving behind vias and trenches in the inter-insulation layer. An advantage of the invention is that it replaces a difficult RIE process of vias and trenches with a much easier RIE of sacrificial pillars and bridges. In the preferred embodiment, a silicon film, either amorphous or polycrystalline, is used as the sacrificial layer.

BRIEF DESCRIPTION OF THE DRAWINGS

The foregoing and other objects, aspects and advantages will be better understood from the following detailed description of a preferred embodiment of the invention with reference to the drawings, in which:

FIGS. 2a, 2b, 2c, 2d and 2e are a series of block diagrams illustrating a prior art "via first" dual-damascene process;

FIGS. 3a, 3b, 3c, 3d and 3e are a series of block diagrams illustrating a prior art "trench first with etch stop layer (ESL)" dual damascene process;

FIGS. 5a, 5b, 5c, 4d and 4e are a series of block diagrams illustrating a prior art "one step etching of trench and via with ESLs" dual damascene process;

FIGS. 7a, 7b, 7c, 7d, 7e, 7f, 7g and 7h are a series of block diagrams showing a dual damascene process according to a second embodiment of the present invention.

DETAILED DESCRIPTION OF A PREFERRED EMBODIMENT OF THE INVENTION

Figure 1A:
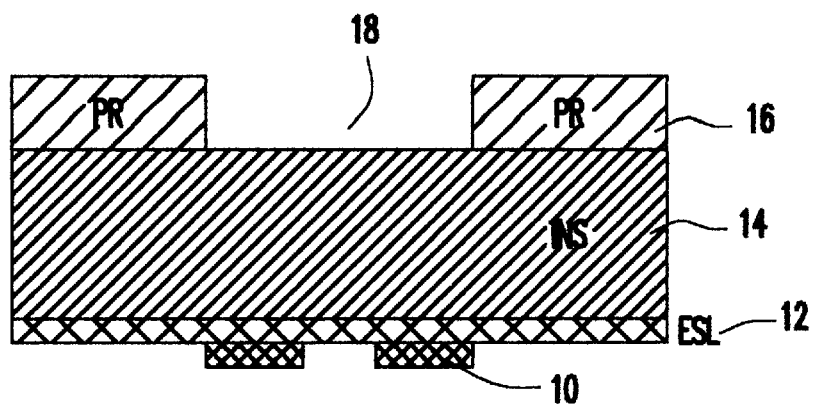
FIGS. 1a, 1b, 1c and 1d are a series of block diagrams illustrating a prior art "trench first" dual-damascene process.
Figure 1B:
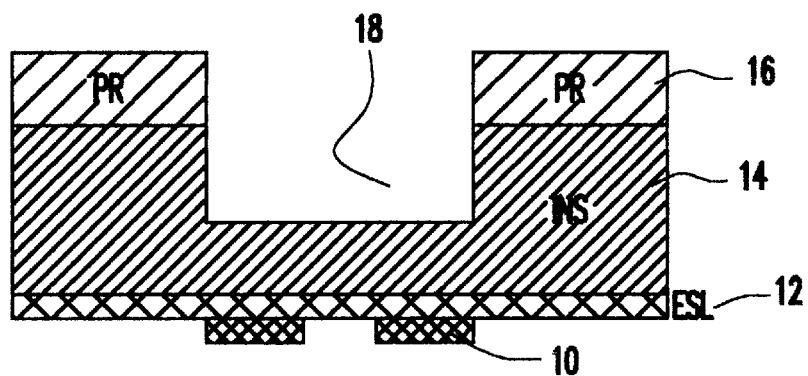
Figure 1C:
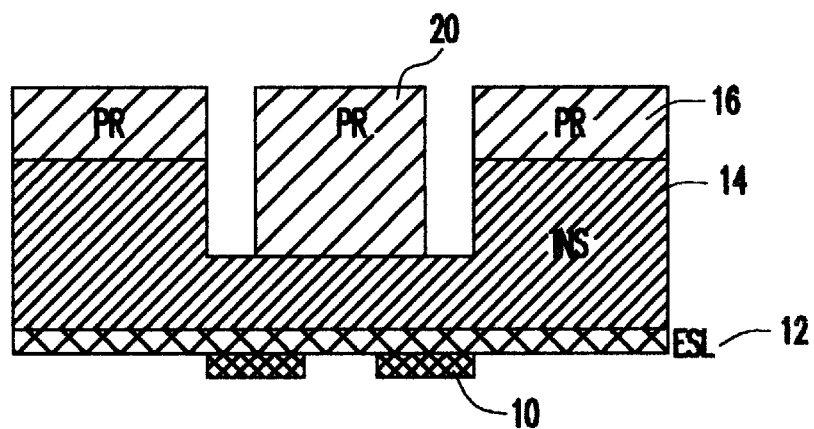
Figure 1D:
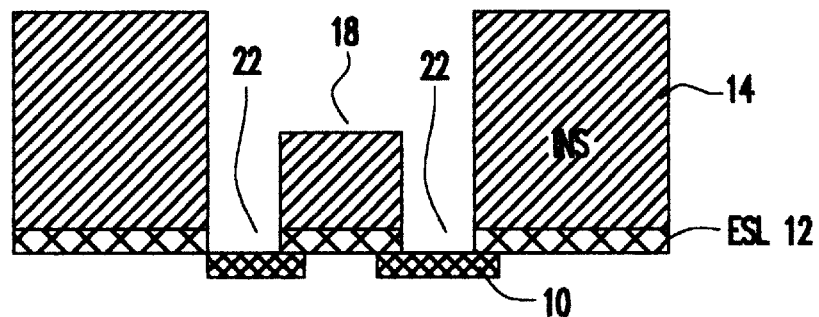
Figure 4A:
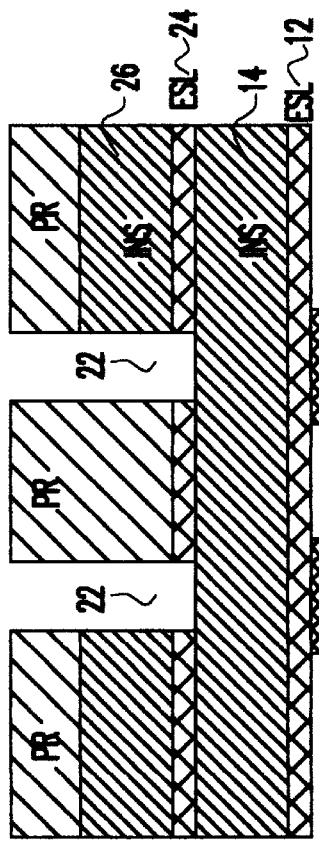
FIGS. 4a, 4b, 4c, 4d and 4e are a series of block diagrams illustrating a prior art "via first with ESL" dual damascene process.
Figure 4B:
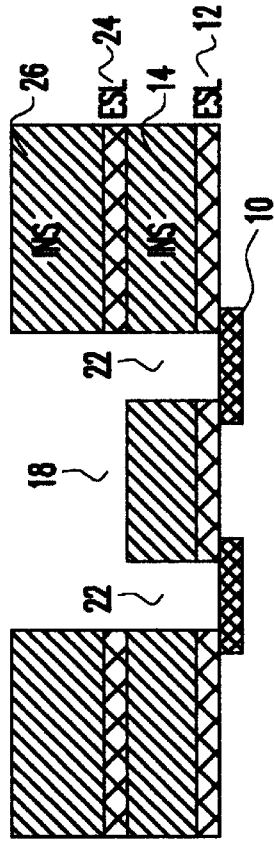
Figure 4C:
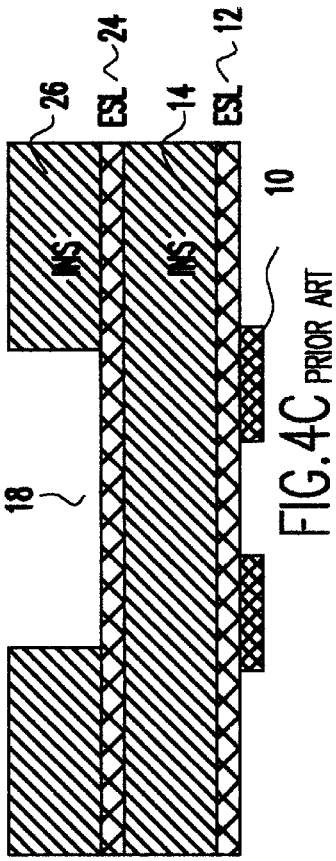
Figure 4D:
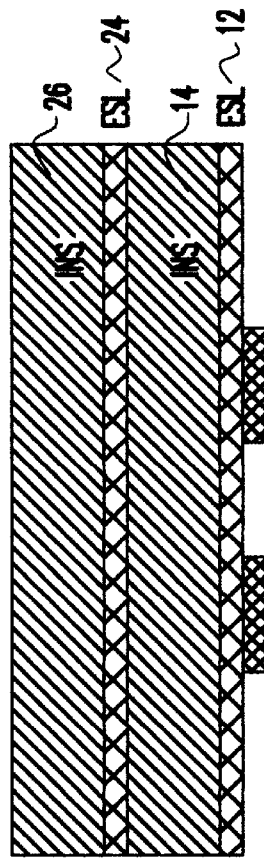
Figure 4E:
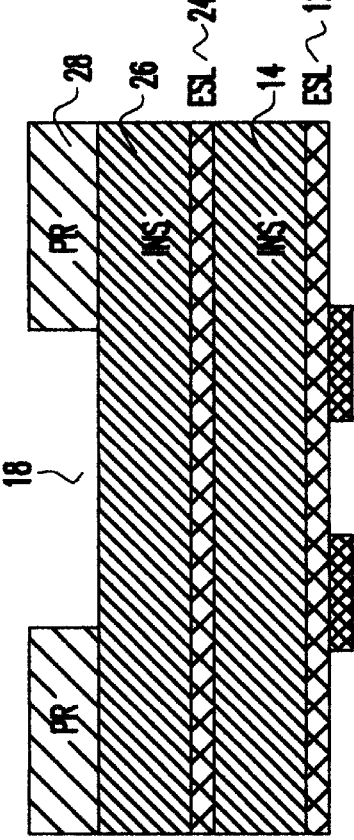
Figure 5A:
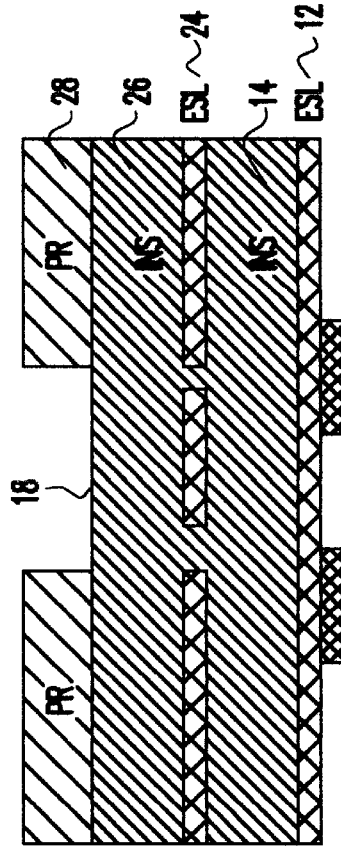
Figure 5B:
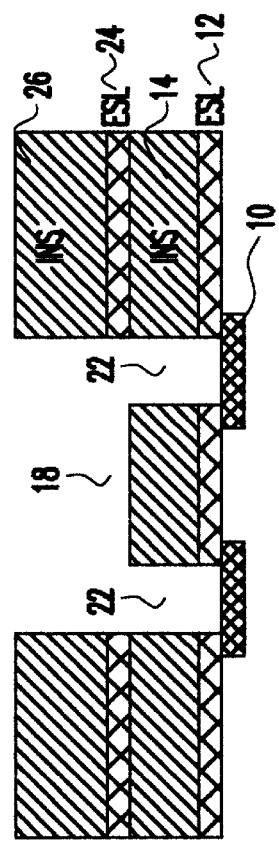
Figure 5C:
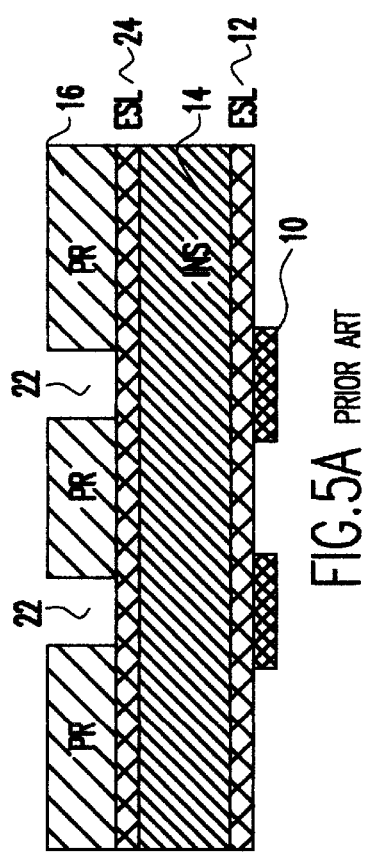
Figure 5D:
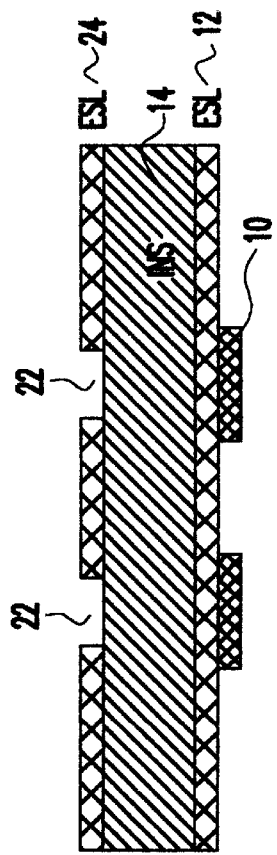
FIGS. 6a, 6b, 6c and 5d are a series of block diagrams showing a dual damascene process according to a first embodiment of the present invention.
Figure 6D:
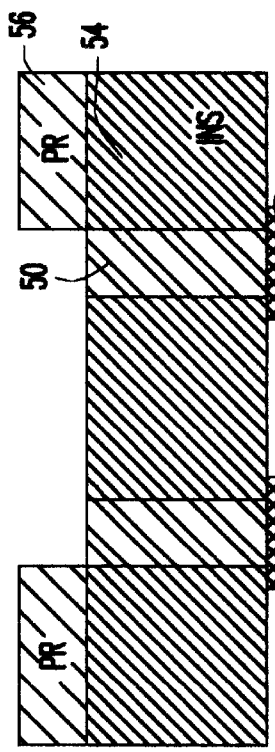
Figure 6E:
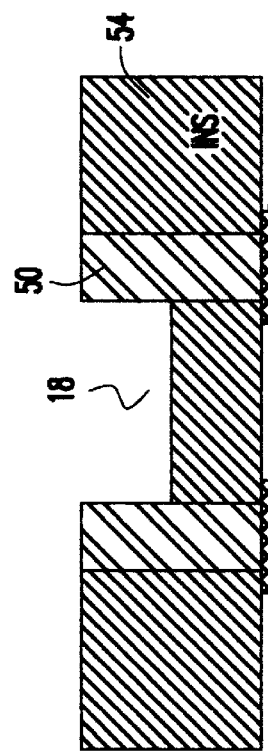
Figure 6F:
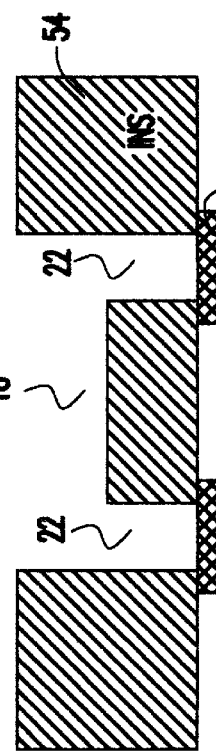
Figure 6A:
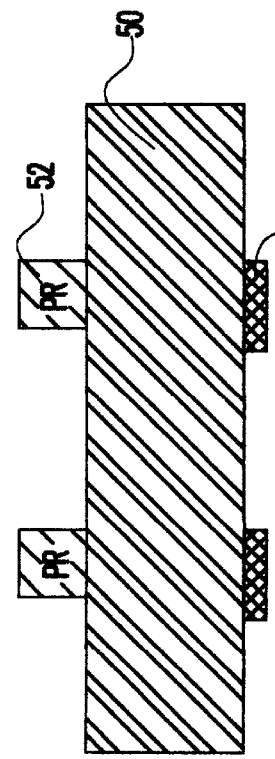

Referring now to the drawings, and more particularly to FIGS. 6a–6f there is shown a series of block diagrams showing a dual damascene process according to a first embodiment of the present invention. As shown in FIG. 6a a sacrificial layer of Si film 50 is deposited over the wires 10. A photo-resist mask 52 is the deposited to reverse pattern the vias. The thickness of the sacrificial Si film 50 is of a thickness corresponding to the depth of the desired via plus trench. It is noted that the sacrificial layer 50 is not limited Si, but can be any material (insulator, semiconductor, or metal), provided it can be easily patterned and selectively removed later. In the preferred embodiment, a silicon film, either amorphous or polycrystalline, is used as the sacrificial layer.

Figure 6B:
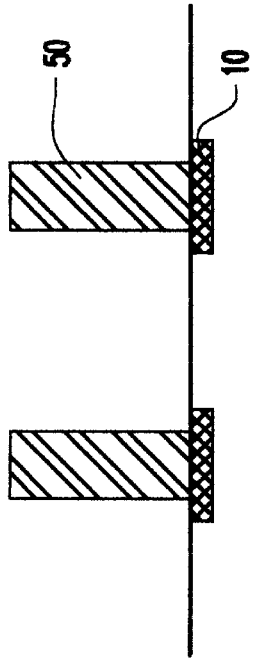
Figure 6C:
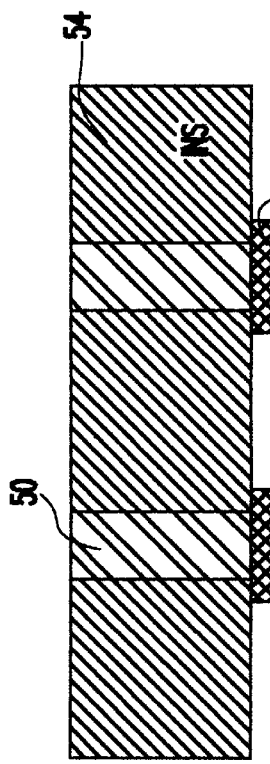

In FIG. 6b a reactive ion etch (RIE) is used to etch the sacrificial Si layer 50 leaving behind sacrificial pillars 50 beneath the photo-resist mask 52. The photo-resist mask 52 is then removed. In FIG. 6c, a an inter insulator layer 54 is deposited, followed by planarization by either etch back or chem-mech polish to make the top surface of the inter-insulation layer 54 flush with the top surface of the sacrificial pillars 50. In FIG. 6d, the trench pattern is defined by a second photo-resist mask 56 deposited over the inter-insulation layer 54. As shown in FIG. 6e, the trench 18 is etched and the second photo-resist trench mask 56 is stripped. Finally, as shown in FIG. 6f, the sacrificial Si pillars are removed from the from vias 22 by wet chemistry, creating a dual-damascene structure in the inter-layer insulator 54. This new process ensures a full area of the cross section of vias and more importantly guarantees good electrical contact between vias 22 and trench 18, minimizing problems caused by a mask overlay accuracy mentioned with regard to the prior art. Si etching of pillars can be easily achieved using a poly-silicon gate etch process which has a suitable selectivity over silicon dioxide. The height of the Si pillars can be varied anywhere from a via height to overall height of vias and trenches, depending on the needs in a subsequent process step. If one wants to use Si pillars for an etch endpoint during a trench etch, the Si pillar should be the same height as vias. These Si pillars also have several other advantages. For example, the sacrificial pillars can act as a mechanical enforcement structure to support a mechanically weak low-k inter-insulation material, if such a material is needed for multilevel interconnection. The sacrificial pillars can also be used as an endpoint method to stop the chemical-mechanical polishing of the low-k inter-insulation material. In adition, the sacrificial pillars help to support or hold the low-k insulating material from delaminating from the Cu under layer.

Some examples of low dielectric constant (low-k) materials are as follows:

$SiO_2$: k=3.8

Fluorosilicate glass (FSG or SiOF): k≈3.5

Hydrogenated diamondlike carbon (DLC) or fluorine containing DLC: k≈2.7–3.4 polystyrene: k≈2.6

H-silsesquoixanes: k≈2.7–3

Fluorinate polyimid: k≈2.5–3 parylene (AF-4): k≈2.2–2.3 amorphous fluorinated carbon (α-F:C): k≈2.1–2.8 porous SiO$_2$ k≈2–3 polytetrafluoro ethylene (TEFLON): k≈1.9

Referring now to FIGS. 7a–7h there is shown a second embodiment of the present invention for forming a dual-damascene structure utilizing Si sacrificial vias and trenches.

Referring to FIG. 7a, a sacrificial Si layer 60 is deposited over wires 10 and a photo-resist mask is deposited 62 to pattern the vias. Thereafter, as shown in FIG. 7, the sacrificial Si layer 60 is etched forming sacrificial pillars 64 of via height. In FIG. 7c, a low-k dielectric polymer insulator layer 66 is spin-on deposited, followed by etch back for planarization. In FIG. 7d, a low temperature deposition of an amorphous Si layer 68 is deposited and, in FIG. 7e, a photo-resist mask is deposited to define the trench area. In FIG. 7f, the Si layer 68 is etched off to form bridges 72 which stand on the Si pillars 64. In FIG. 7g, an additional layer of low-k dielectric polymer is deposited on the first layer of low-k dielectric polymer 66 followed by a polymer etch back for planarization to form the insulator inter-layer 66. Finally, in FIG. 7h, the Si pillars 64 and bridges 72 are removed by wet etching, leaving behind a dual-damascene structure forming vias 22 and trenches 18. This process sequence is particularly suited when using mechanically weak polymer films of low-k dielectric for the inter layer 66, which may be eventually needed in the foreseeable future. This process scenario eliminates the entire RIE process of the inter layer insulator, consequently avoiding many complicated issues associated with the etching of low-k materials.

What is claimed is:

1. A method for forming trenches and vias in a single step in an inter-insulation layer for a dual damascene structure with via and trench heights, without etching out the inter-insulation layer, comprising the steps of:

depositing a first sacrificial layer to the height of vias;

etching said sacrificial layer to form sacrificial pillars in a location of said vias;

depositing a first inter-insulation layer planarized with tops of said sacrificial pillars;

depositing a second sacrificial layer over said first inter-insulation layer to the height of a trench;

etching said second sacrificial layer to form a sacrificial bridge in a location of said trench;

depositing a second inter-insulation layer on said first inter-insulation layer planarized with said sacrificial bridge; and selectively etching said sacrificial bridge and said sacrificial pillars to form said trench and vias in a single step.

2. A method for forming trenches and vias in a single step in an inter-insulation layer for a dual damascene structure as recited in claim 1 wherein said first and second sacrificial layers comprise silicon.

3. A method for forming trenches and vias in a single step in an inter-insulation layer for a dual damascene structure as recited in claim 2 wherein said first and second sacrificial layers comprise amorphous silicon.

4. A method for forming trenches and vias in a single step in an inter-insulation layer for a dual damascene structure as recited in claim 2 wherein said first and second sacrificial layers comprise polycrystalline silicon.

5. A method for forming trenches and vias in a single step in an inter-insulation layer recited in claim inter-insulation layer for a dual damascene structure as 1 wherein said first and second layers comprise a low-k dielectric material.

6. A method for forming trenches and vias in a single step in an inter-insulation layer for a dual damascene structure as recited in claim 5 wherein said low-k dielectric material has a k value from 1<k<4.

* * * * *